United States Patent
Zuolo et al.

(10) Patent No.: US 11,514,994 B1
(45) Date of Patent: Nov. 29, 2022

(54) METHOD AND APPARATUS FOR OUTLIER MANAGEMENT

(71) Applicant: Microchip Technology Inc., Chandler, AZ (US)

(72) Inventors: Lorenzo Zuolo, Lusia (IT); Rino Micheloni, Moltrasio (IT)

(73) Assignee: Microchip Technology Inc., Chandler, AZ (US)

(*) Notice: Subject to any disclaimer, the term of this patent is extended or adjusted under 35 U.S.C. 154(b) by 0 days.

(21) Appl. No.: 17/506,735

(22) Filed: Oct. 21, 2021

Related U.S. Application Data

(60) Provisional application No. 63/194,387, filed on May 28, 2021.

(51) Int. Cl.
| | |
|---|---|
| *G11C 29/00* | (2006.01) |
| *G11C 29/02* | (2006.01) |
| *G11C 29/44* | (2006.01) |
| *G11C 11/54* | (2006.01) |
| *G11C 29/50* | (2006.01) |
| *G11C 29/10* | (2006.01) |

(52) U.S. Cl.
CPC ............ *G11C 29/021* (2013.01); *G11C 11/54* (2013.01); *G11C 29/10* (2013.01); *G11C 29/4401* (2013.01); *G11C 29/50004* (2013.01)

(58) Field of Classification Search
CPC ... G11C 29/021; G11C 29/10; G11C 29/4401; G11C 29/5004; G11C 11/54
See application file for complete search history.

(56) References Cited

U.S. PATENT DOCUMENTS

| | | | |
|---|---|---|---|
| 6,567,313 B2 | 5/2003 | Tanaka et al. | |
| 6,704,871 B1 | 3/2004 | Kaplan et al. | |
| 7,529,215 B2 | 5/2009 | Osterling et al. | |
| 7,650,480 B2 | 1/2010 | Jiang | |
| 7,930,623 B2 | 4/2011 | Pisek et al. | |

(Continued)

FOREIGN PATENT DOCUMENTS

WO   2020117348 A3   12/2020

OTHER PUBLICATIONS

U.S. Appl. No. 17/089,891, dated Nov. 5, 2020, Lorenzo Zuolo.

(Continued)

*Primary Examiner* — Christine T. Tu
(74) *Attorney, Agent, or Firm* — Glass and Associates; Kenneth Glass

(57) ABSTRACT

A method for outlier management at a flash controller includes testing a flash memory device to identify one or more outlier blocks of the flash memory device. Hyperparameters for a DNN are loaded into a training circuit of the flash controller. Test reads of the one or more outlier blocks are performed and a number of errors in the test reads is identified. The DNN is trained using a mini-batch training process and using the identified number of errors in the test reads and is tested to determine whether the trained DNN meets a training error threshold. The performing, the identifying, the training and the testing are repeated until the trained DNN meets the training error threshold to identify parameters of an outlier-block DNN. A neural network operation is performed using the identified parameters to predict a set of TVSO values. A read is performed using the set of predicted TVSO values.

20 Claims, 7 Drawing Sheets

(56) References Cited

U.S. PATENT DOCUMENTS

| | | |
|---|---|---|
| 8,429,325 B1 | 4/2013 | Onufryk et al. |
| 8,621,318 B1 | 12/2013 | Micheloni et al. |
| 8,656,257 B1 | 2/2014 | Micheloni et al. |
| 8,665,648 B2 | 3/2014 | Mun et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,966,335 B2 | 2/2015 | Lunelli et al. |
| 8,971,112 B2 | 3/2015 | Crippa et al. |
| 8,990,661 B1 | 3/2015 | Micheloni et al. |
| 9,092,353 B1 | 7/2015 | Micheloni et al. |
| 9,128,858 B1 | 9/2015 | Micheloni et al. |
| 9,235,467 B2 | 1/2016 | Micheloni et al. |
| 9,251,909 B1 | 2/2016 | Camp et al. |
| 9,268,531 B1 | 2/2016 | Woo et al. |
| 9,292,428 B2 | 3/2016 | Kanamori et al. |
| 9,305,661 B2 | 4/2016 | Micheloni et al. |
| 9,397,701 B1 | 7/2016 | Micheloni et al. |
| 9,417,804 B2 | 8/2016 | Micheloni et al. |
| 9,444,655 B2 | 9/2016 | Sverdlov et al. |
| 9,448,881 B1 | 9/2016 | Micheloni et al. |
| 9,450,610 B1 | 9/2016 | Micheloni et al. |
| 9,454,414 B2 | 9/2016 | Micheloni et al. |
| 9,590,656 B2 | 3/2017 | Micheloni et al. |
| 9,747,200 B1 | 8/2017 | Micheloni |
| 9,799,405 B1 | 10/2017 | Micheloni et al. |
| 9,813,080 B1 | 11/2017 | Micheloni et al. |
| 9,886,214 B2 | 2/2018 | Micheloni et al. |
| 9,892,794 B2 | 2/2018 | Micheloni et al. |
| 9,899,092 B2 | 2/2018 | Micheloni |
| 10,152,273 B2 | 12/2018 | Micheloni et al. |
| 10,157,677 B2 | 12/2018 | Marelli et al. |
| 10,216,422 B2 | 2/2019 | Kim et al. |
| 10,230,396 B1 | 3/2019 | Micheloni et al. |
| 10,283,215 B2 | 5/2019 | Marelli et al. |
| 10,291,263 B2 | 5/2019 | Marelli et al. |
| 10,332,613 B1 | 6/2019 | Micheloni et al. |
| 10,490,288 B1 | 11/2019 | Wang et al. |
| 10,715,307 B1 | 7/2020 | Jin |
| 10,861,562 B1 | 12/2020 | Xiong et al. |
| 11,398,291 B2 | 7/2022 | Zuolo et al. |
| 2006/0106743 A1 | 5/2006 | Horvitz |
| 2006/0282603 A1 | 12/2006 | Onufryk et al. |
| 2007/0076873 A1 | 4/2007 | Yamamoto et al. |
| 2011/0255453 A1 | 10/2011 | Roh et al. |
| 2012/0166714 A1 | 6/2012 | Mun et al. |
| 2012/0287719 A1 | 11/2012 | Mun et al. |
| 2014/0281800 A1 | 9/2014 | Micheloni et al. |
| 2014/0281823 A1 | 9/2014 | Micheloni et al. |
| 2014/0310534 A1 | 10/2014 | Gurgi et al. |
| 2015/0033037 A1 | 1/2015 | Lidman |
| 2015/0049548 A1 | 2/2015 | Park et al. |
| 2016/0072527 A1 | 3/2016 | Suzuki et al. |
| 2016/0247581 A1 | 8/2016 | Suzuki et al. |
| 2016/0266791 A1 | 9/2016 | Lin et al. |
| 2017/0133107 A1 | 5/2017 | Ryan et al. |
| 2017/0213597 A1 | 7/2017 | Micheloni |
| 2018/0033490 A1 | 2/2018 | Marelli et al. |
| 2019/0004734 A1 | 1/2019 | Kirshenbaum et al. |
| 2019/0087119 A1 | 3/2019 | Oh et al. |
| 2019/0095794 A1* | 3/2019 | Aldana López ....... G06N 20/00 |
| 2019/0317901 A1 | 10/2019 | Kachare et al. |
| 2020/0004455 A1 | 1/2020 | Williams et al. |
| 2020/0066361 A1 | 2/2020 | Ioannou et al. |
| 2020/0074269 A1 | 3/2020 | Trygg et al. |
| 2020/0125955 A1 | 4/2020 | Klinger et al. |
| 2020/0151539 A1 | 5/2020 | Oh et al. |
| 2020/0185027 A1 | 6/2020 | Rom et al. |
| 2020/0210831 A1 | 7/2020 | Zhang et al. |
| 2021/0192333 A1* | 6/2021 | Thiruvengadam .... G06F 11/008 |
| 2022/0027083 A1 | 1/2022 | Zuolo et al. |
| 2022/0051730 A1* | 2/2022 | Choi ..................... G06F 3/0659 |
| 2022/0058488 A1 | 2/2022 | Zuolo et al. |
| 2022/0188604 A1 | 6/2022 | Zuolo et al. |
| 2022/0270698 A1 | 8/2022 | Zuolo et al. |

OTHER PUBLICATIONS

U.S. Appl. No. 17/148,200, dated Jan. 13, 2021, Lorenzo Zuolo.
U.S. Appl. No. 17/213,675, dated Mar. 26, 2021, Lorenzo Zuolo.
U.S. Appl. No. 17/234,993, dated Apr. 20, 2021, Lorenzo Zuolo.
U.S. Appl. No. 17/347,388, dated Jun. 14, 2021, Lorenzo Zuolo.
U.S. Appl. No. 17/385,857, dated Jul. 26, 2021, Lorenzo Zuolo.
U.S. Appl. No. 17/398,091, dated Aug. 10, 2021, Lorenzo Zuolo.
U.S. Appl. No. 17/506,735, dated Oct. 21, 2021, Lorenzo Zuolo.
U.S. Appl. No. 63/057,278, dated Jul. 27, 2020, Lorenzo Zuolo.
Noam Shazeer et al: Outrageously Large Neural Networks: The Sparsely-Gated Mixture-of-Experts Layer11 , Arxiv .Org, Cornell University Li Bra Ry, 201 Olin Li Bra Ry Cornell University Ithaca, NY 14853, Jan. 23, 2017.
Yu Cai et al, "Errors in Flash-Memory-Based Solid-State Drives: Analysis, Mitigation, and Recovery" 11 , Arxiv. Org, Cornell University Library, 201 Olin Library Cornell University Ithaca, NY 14853, Nov. 28, 2017.
PCT/US2022/011036, International Search Report and Written Opinion, European Patent Office, dated Apr. 25, 2022.
Anonymous, "Training checkpoints | TensorFlow Core", Dec. 28, 2019, XP055886114, p. 1-p. 8, Retrieved from the Internet.

* cited by examiner

30

METHOD AND APPARATUS FOR OUTLIER MANAGEMENT

CROSS-REFERENCE TO RELATED APPLICATIONS

The present application claims priority to U.S. Provisional Patent Application Ser. No. 63/194,387 filed on May 28, 2021, the contents of which are incorporated by reference herein in their entirety.

BACKGROUND OF THE INVENTION

The reliability of a device is an indication of the probability that the device will perform its intended function during a specified period of time under stated conditions. Because age of flash memory devices is typically measured as a function of the number of program and erase (PE) cycles of the flash memory device (or the number of PE cycles of individual blocks of the flash memory device), the reliability of flash memory devices are typically determined based on the number of PE cycles of the flash memory device (or the number of PE cycles of each block of the flash memory device). Reliability states that correspond to a particular number (or range) of PE cycles of a flash memory device or a block of a flash memory device are referred to hereinafter as PE-based reliability states.

PE-based reliability states are usually created by identifying the number of PE cycles in the expected lifetime of the flash memory device or the expected lifetime of individual blocks of the flash memory device and dividing the expected lifetime of the flash memory device (or blocks of the flash memory device) into a number of periods based on the number of PE cycles, such that the periods span the entire lifetime of the flash memory device (or blocks of the flash memory device).

For example, in one exemplary system each flash memory device or block of the flash memory device (flash memory device/block) has an anticipated end of life of 5,000 PE cycles and the lifetime of the flash memory device/block is divided into five periods based on the number of PE cycles such that a first period (that defines a first PE-based reliability state) corresponds to the first thousand PE cycles (0-1000 PE cycles) of the flash memory device/block, a second period (that defines a second PE-based reliability state) corresponds to the next thousand PE cycles (1001-2000 PE cycles) of the flash memory device/block, a third period (that defines a third PE-based reliability state) corresponds to the next thousand PE cycles (2001-3000 PE cycles) of the flash memory device/block, a fourth period (that defines a fourth PE-based reliability state) corresponds to the next thousand PE cycles (3001-4000 PE cycles) of the flash memory device/block and a fifth period (that defines a fifth PE-based reliability state) corresponds to the last thousand PE cycles (4001-5000 PE cycles) of the flash memory device/block.

Some Solid State Drives (SSD's) use threshold-voltage-shift reads for reading flash memory devices to obtain low levels of Uncorrectable Bit Error Rate (UBER) required for client and enterprise SSD's. Threshold-voltage-shift reads are performed by sending a threshold-voltage-shift read instruction from a flash controller to a flash memory device that is to be read. One or more threshold-Voltage-Shift Offset (TVSO) value is sent with the threshold-voltage-shift read instruction. The TVSO value indicates the amount by which the threshold voltage that is used to perform the read is to be offset from a corresponding default threshold voltage that is specified by the manufacturer of the flash memory device. Systems that use threshold-voltage-shift read instructions for reading flash memory devices typically use a set of TVSO values corresponding to a PE-based reliability state for performing a read of the flash memory device. Flash memory manufacturers typically publish a product specification that includes a set of TVSO values for each PE-based reliability state (e.g. a plurality of sets of TVSO values, and for each set of TVSO values the range of PE cycles where that set of TVSO values is recommended). The flash controller then needs only to identify the current number of PE cycles of the flash memory device or the block of the flash memory device to be read and look up the corresponding set of TVSO values (e.g., using a lookup table) and then send the identified set of TVSO values along with the address to be read to the flash memory device. In response the flash memory device performs a read of the address at the specified TVSO values and returns the results of the read to the flash controller.

Some users and flash controller manufacturers perform flash memory characterization testing of exemplary flash memory devices to identify TVSO values that are more precise than those specified by the manufacturer of the flash memory device. In an effort to more accurately identify TVSO values to be used in reads, some of these users and flash controller manufacturers expand the number of characteristics in the PE-based reliability state by using other characteristics to define the PE-based reliability state such as the retention time and/or the number of read disturbs of the block to be read. These conventional PE-based reliability states and devices work well for almost all of the blocks of the SSD. However, as the SSD approaches end-of-life some blocks begin to diverge from the performance of the other blocks in a particular PE-based reliability state. These blocks are typically referred to as "outlier blocks." Outlier blocks are typically identified by the fact that they have a higher raw bit error rate (RBER) than the other blocks in their PE-based reliability state.

Some SSD's perform background error testing of each of the memory blocks in the SSD to identify RBER in each read. When the RBER exceeds a predetermined error threshold the block is identified to be a bad block. Once a block is identified as a bad block, it is no longer used by the SSD in order to prevent an uncorrectable bit error during operation (e.g., when there are too many errors in a particular page for soft-error correction). When uncorrectable bit errors occur during operation a Redundant Array of Independent Disks (RAID) operation is required to recover the stored data, resulting in increased system latency and negatively impacting quality of service (QoS) of the SSD.

Conventional SSD's typically do not try to manage outlier blocks other than to test them and remove them from service when they reach the predetermined error threshold. However, removing outlier blocks from service reduces the amount of storage space available to store data.

Accordingly, for systems that use threshold-voltage-shift read instructions for reading flash memory devices, there is a need for a method and apparatus that will extend the useful life of outlier blocks while maintaining UBER of the SSD within acceptable levels during the lifetime of the SSD.

SUMMARY OF THE INVENTION

A method for outlier block management at a flash controller that uses TVSO values for performing reads of a flash memory device includes testing the flash memory device to identify one or more outlier blocks of the flash memory device, the one or more outlier blocks having a number of errors greater than an outlier-error threshold; and loading hyperparameters for a deep neural network (DNN) into a training circuit of the flash controller. A plurality of test reads of the one or more outlier blocks are performed and a number of errors in the test reads are identified. The DNN is trained at the training circuit using a mini-batch training process and using the identified number of errors in the test reads. The trained DNN is tested to determine whether the trained DNN meets a training error threshold (TET) and the performing the plurality of test reads, the identifying the number of errors in the test reads, the training and the testing are repeated until the trained DNN meets the TET to identify parameters of an outlier-block DNN. A neural network operation is performed at a neural network engine of the flash controller using the identified parameters of the outlier-block DNN to predict TVSO values corresponding to the one or more outlier blocks; and a read is performed using the predicted TVSO values.

A flash controller includes a read circuit coupled to a TVSO-read table indicating TVSO values to be used for reading a flash memory device and a decode circuit coupled to the read circuit, the decode circuit configured to decode reads of the flash memory device. The flash controller includes a training circuit and a control circuit coupled to the training circuit. The control circuit is to identify one or more outlier blocks of the flash memory device, the outlier blocks having a number of errors greater than an outlier-error threshold, and to load hyperparameters for a deep neural network (DNN) into the training circuit. The read circuit is to perform a plurality of test reads of the identified one or more outlier blocks. The decode circuit is to identify the number of errors in the test reads of the identified one or more outlier blocks. The training circuit is to train the DNN using a mini-batch training process and using the identified number of errors in the test reads and to test the trained DNN to determine whether the trained DNN meets a training error threshold. The training circuit, the decode circuit and the control circuit is to repeat performing the plurality of test reads, identifying the number of errors in the test reads, training and testing until the trained DNN meets the TET to identify parameters of an outlier-block DNN. A neural network engine is coupled to the training circuit and the control circuit, the neural network engine to perform a neural network operation using the parameters of the outlier-block DNN to predict TVSO values corresponding to the one or more outlier blocks. The control circuit is to store the predicted TVSO values, and the read circuit is to perform a read using the predicted TVSO values.

A method for outlier management at a flash controller that uses threshold voltage shift offset (TVSO) values for performing reads of a flash memory device includes: performing a plurality of test reads of an outlier block, the outlier block having a number of errors greater than a training error threshold; and identifying a number of errors in the test reads. Hyperparameters for a deep neural network (DNN) are loaded into a training circuit of the flash controller. The DNN is trained at the training circuit using a mini-batch training process and using the identified number of errors in the test reads; and the trained DNN is tested to determine whether the trained DNN meets a TET. The performing the plurality of test reads, the identifying the number of errors in the test reads, the training and the testing are repeated until the trained DNN meets the TET to identify parameters of an outlier-block DNN. A neural network operation is performed at a neural network engine of the flash controller using the identified parameters of the outlier-block DNN to predict TVSO values corresponding to the one or more outlier block. The predicted TVSO values are stored and a read is performed using the predicted TVSO values.

The disclosed method and apparatus manages outlier blocks by performing neural network operations that accurately predict the TVSO values to be used for reading the outlier blocks, allowing the outlier blocks to continue to be used even after they are identified as outlier blocks. Thereby, the method and apparatus of the present invention does not require that outlier blocks be marked as bad blocks and retired as soon as they are identified as outlier blocks, increasing the number of blocks available for use by the SSD. Accordingly, the present method and apparatus extends the useful life of outlier blocks while maintaining UBER of the SSD within acceptable levels during the lifetime of the SSD.

BRIEF DESCRIPTION OF THE DRAWINGS

The accompanying drawings are included to provide a further understanding of the invention, and are incorporated in, and constitute a part of, this specification. The drawings illustrate various examples. The drawings referred to in this brief description are not drawn to scale.

DETAILED DESCRIPTION

Figure 1:
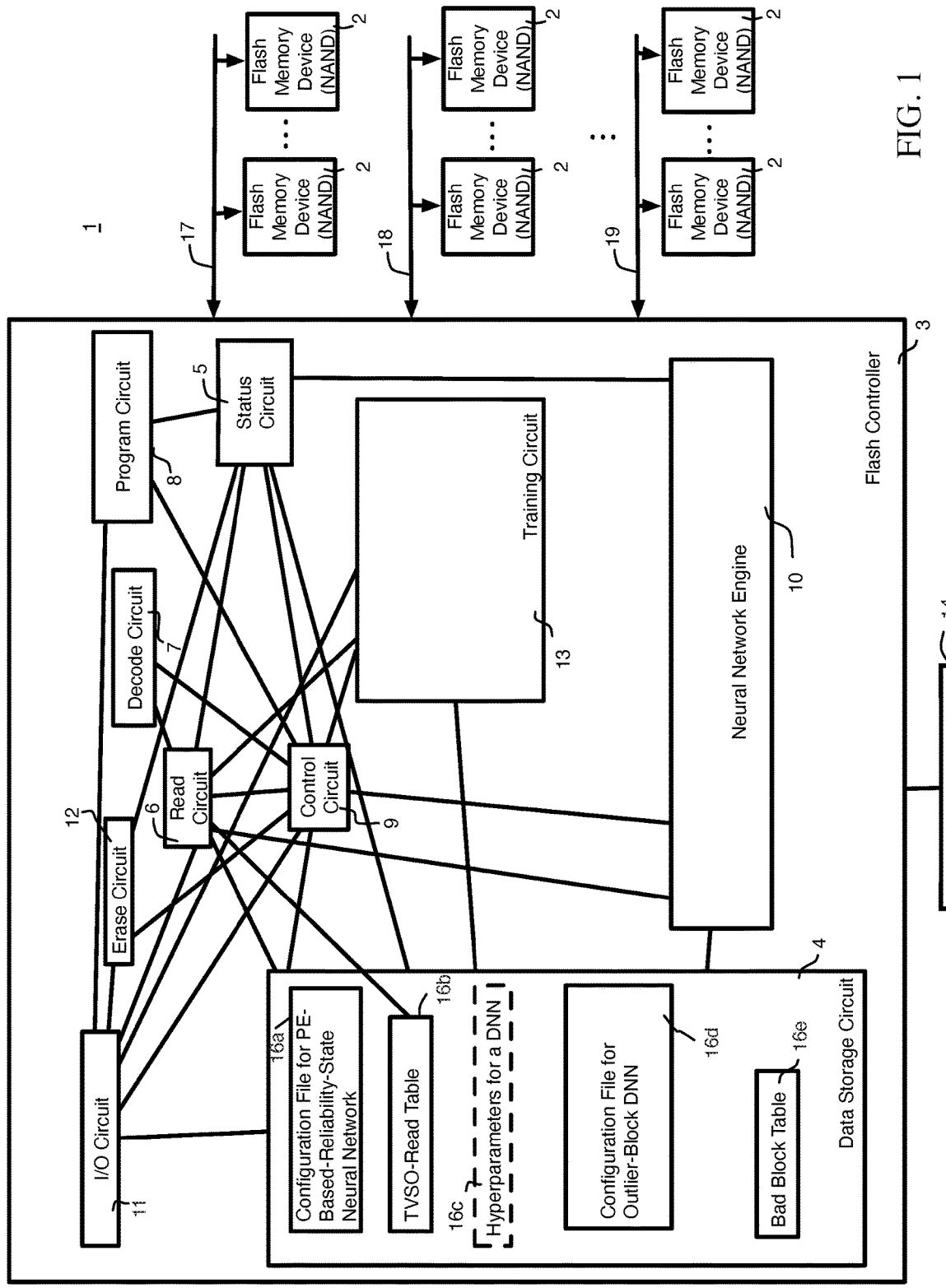
FIG. 1 is a diagram illustrating a SSD that includes a flash controller, flash memory devices and a memory device.

FIG. 1 shows an SSD 1 that includes a flash controller 3, a plurality of flash memory devices 2 and a memory device 14. Flash controller 3 is coupled to flash memory devices 2 for storing data and for reading data from flash memory devices 2. In one example, the flash memory devices 2 are NAND devices connected to form a plurality of channels (e.g. channels 17-19) and flash controller 3, flash memory devices 2 and memory device 14 are devices mounted to a circuit board (not shown). In one example, SSD 1 includes a plurality of flash packages, each flash package containing 8 flash memory die such that there are 8 die for each channel 17-19. Memory device 14 is a volatile memory device such as a Dynamic Random Access Memory (DRAM) that is electrically coupled to flash controller 3.

Flash controller 3 is an integrated circuit device that includes data storage circuit 4, status circuit 5, read circuit 6, decode circuit 7, program circuit 8, control circuit 9, neural network engine 10, training circuit 13, input and output (I/O) circuit 11 and erase circuit 12. Data storage circuit 4 includes a configuration file for a PE-based-reliability-state neural network 16a that predicts TVSO values using PE-based reliability states, a TVSO-read table 16b, optionally hyperparameters for a DNN 16c and one or more configuration files for an outlier-block DNN 16d. A DNN is a neural network having more than a single hidden layer of neurons.

Control circuit 9 is coupled to data storage circuit 4, status circuit 5, read circuit 6, decode circuit 7, program circuit 8, neural network engine 10, I/O circuit 11, erase circuit 12 and training circuit 13. Decode circuit 7 is further coupled to read circuit 6. Status circuit 5 is further coupled to data storage circuit 4, read circuit 6, program circuit 8, neural network engine 10 and erase circuit 12. Read circuit 6 is further coupled to data storage circuit 4, neural network engine 10, I/O circuit 11 and training circuit 13. Neural network engine 10 is further coupled to data storage 4. I/O circuit 11 is further coupled to data storage 4, program circuit 8, erase circuit 12 and training circuit 13. Training circuit 13 is further coupled to data storage circuit 4.

Some or all of circuit 5, read circuit 6, decode circuit 7, program circuit 8, control circuit 9, neural network engine 10, input and output (I/O) circuit 11, erase circuit 12 and training circuit 13 are dedicated circuits for performing operations, and some or all of circuit 5, read circuit 6, decode circuit 7, program circuit 8, control circuit 9, neural network engine 10, input and output (I/O) circuit 11, erase circuit 12 and training circuit 13 can be firmware that includes instructions that are performed on one or more processor for performing operations of flash controller 3, with the instructions stored in registers of one or more of circuit 5, read circuit 6, decode circuit 7, program circuit 8, control circuit 9, neural network engine 10, input and output (I/O) circuit 11, erase circuit 12 and training circuit 13 and/or stored in data storage 4 or memory device 14. Some of all of circuit 5, read circuit 6, decode circuit 7, program circuit 8, control circuit 9, neural network engine 10, training circuit 13, input and output (I/O) circuit 11 and erase circuit 12 include processors for performing instructions and instructions are loaded into flash controller 3 prior to operation of flash controller 3 by a user.

In one example, each time that a block is closed, status circuit 5 is operable to count the number of reads of the block while the block is closed and the number of reads of the block while the block is closed is stored as a read disturb value (RD) for the block. When a block is erased the RD of the erased block is reset to zero. Each time that a block is closed, status circuit 5 is operable to start a timer to determine the amount of time that has elapsed since the block was closed. The elapsed time as determined by the timer at any point in time is defined as the retention time (RT) for the block (e.g. a closed-block retention time value). When a block is erased the timer for that block is stopped and the closed-block retention time value of the erased block is reset to zero. Status circuit 5 is also operable for counting the number of program and erase cycles (PE) of each block of the flash memory device 2 during the entire lifetime of the flash memory device 2 and storing the count in data storage 4 or memory device 14.

Flash controller 3 receives read and write instructions from a host computer at I/O circuit 11, and performs program operations, erase operations and read operations on memory cells of flash memory devices 2 to complete the instructions from the host computer. I/O circuit 11 includes circuitry to receive input and output and coupling the input to internal circuits of flash controller 3 and to couple the output to devices external to flash controller 3. TVSO-read table 16b indicates TVSO values to be used for reading a flash memory device 2. Read circuit 6 performs reads of flash memory devices 2. Decode circuit 7 decodes reads of the flash memory devices 2. Program circuit 8 performs program operations to store data in flash memory devices 2. Erase circuit 12 erases memory locations in one or more of flash memory devices 2. Status circuit 5 tracks the status and the operations of flash controller 3 and flash memory devices 2. In one example, the status includes the current PE cycles the current RT and the current RD of each of the good blocks of each flash memory device 2. Data storage circuit 4 is a structure in flash controller 3 that is capable of storing data, and may include cache memory and/or static random-access memory (SRAM). Neural network engine 11 includes a specialized hardware circuit (e.g., a specialized configurable accelerator) to perform a neural network operation.

I/O circuit 11 includes one or more circuit for receiving a write instruction from a host computer and for coupling the write instruction to program circuit 8. Program circuit 8, in response to receiving the write instruction, programs codewords into on one or more of flash memory devices 2.

I/O circuit 11 includes one or more circuit for receiving a read instruction from a host computer and for coupling the read instruction to read circuit 6. Read circuit 6 in response to receiving the read instruction, performs a lookup in TVSO-read table 16b using the current status of the memory location of the flash memory device 2 that is to be read, as indicated by status circuit 5, identifies the TVSO values to use in performing the read; sends a read command that includes the identified TVSO values to a flash memory device 2 that is to be read; receives a response from the flash memory device 2 and decode circuit 7 is operable to decode the results from the read command.

The sets of TVSO values initially stored in TVSO-read table 16b that may be referred to hereinafter individually as a "set of PE-based-reliability-state TVSO values" are generated using conventional PE-based reliability states as is known in the art, and may be the PE-based-reliability-state TVSO values in the documentation published by the manufacturer of flash memory devices 2. The TVSO-read table can include different sets of PE-based-reliability-state TVSO values for different blocks and can include a block number index associated with each set of PE-based-reliability-state TVSO values.

In one example, a PE cycle index is associated with each set of PE-based-reliability-state TVSO values stored in TVSO-read table 16b and a lookup is performed to identify the set of PE-based-reliability-state TVSO values associated with the PE cycle index that matches the current number of PE cycles and that matches the block number index of the block that is to be read.

In another example, a PE cycle index, RT index and RD index are associated with each set of PE-based-reliability-state TVSO values stored in TVSO-read table 16b and a lookup is performed to identify the set of set of PE-based-reliability-state TVSO values associated with the PE cycle index that matches the current number of PE cycles, the RT index that matches the current RT, the RD index that matches the current RT and the block number of the block that is to be read.

Though PE-based-reliability-state TVSO values stored in TVSO-read table 16b can be obtained from the manufacturer of flash memory devices 2, alternatively, they are determined by performing a neural network operation and storing the results of the neural network operation in TVSO-read table 16b. In one example, a configuration file for a PE-based-reliability-state neural network 16a is stored and a neural network operation is performed to identify the PE-based-reliability-state TVSO values. In one example TVSO-read table 16b are generated as shown in U.S. patent application Ser. No. 17/089,891 filed on Nov. 5, 2020 and titled "Regression Neural Network for Identifying Threshold Voltages to be Used in Reads of Flash Memory Devices;" that is incorporated herein by reference in its entirety.

The blocks that are not to be used by SSD 1, that may be referred to hereinafter as "bad blocks" are indicated in one or more bad block table 16e. Though bad block table 16e is illustrated as being a single table stored in data storage circuit 4, it is appreciated that bad blocks could be indicated using multiple bad block tables (e.g., a table for each flash memory device 2), and that the bad block table(s) could be stored in data storage 14 or in flash memory devices 2. Bad block table 16e includes data identifying each of the blocks that have been indicated to be defective by the manufacturer of a flash memory device 2. During the lifetime of SSD 1, as additional blocks are identified as being defective, bad block table 16e is updated to include an identifier of the defective block so as to prevent usage of the defective block for storing data. Blocks not identified as bad block (either by the manufacturer of the flash memory device 2 or by flash controller 3 during the operation of SSD 1) are referred to hereinafter as "good blocks" and are used during the operation of SSD 1 to perform write and read operations.

Training circuit 13 optionally receives hyperparameters for a DNN 16c and performs neural network training to identify parameters for an outlier-block DNN. In one example, training circuit 13 includes a specialized hardware circuit (e.g., a specialized configurable accelerator) to perform the neural network training operation. In one example training circuit 13 includes a processor and software operable on the processor performs training using a mini-batch training process to generate an outlier-block DNN and to generate and store configuration files for the outlier-block DNN. The term "mini-batch training algorithm," as used in the present application is a training algorithm in which the number of training items that is used to perform a single iteration of training is less than the total number of training items that are used to perform training, and where the number of training items that are used to perform a single iteration of training is greater than one.

Figure 2:
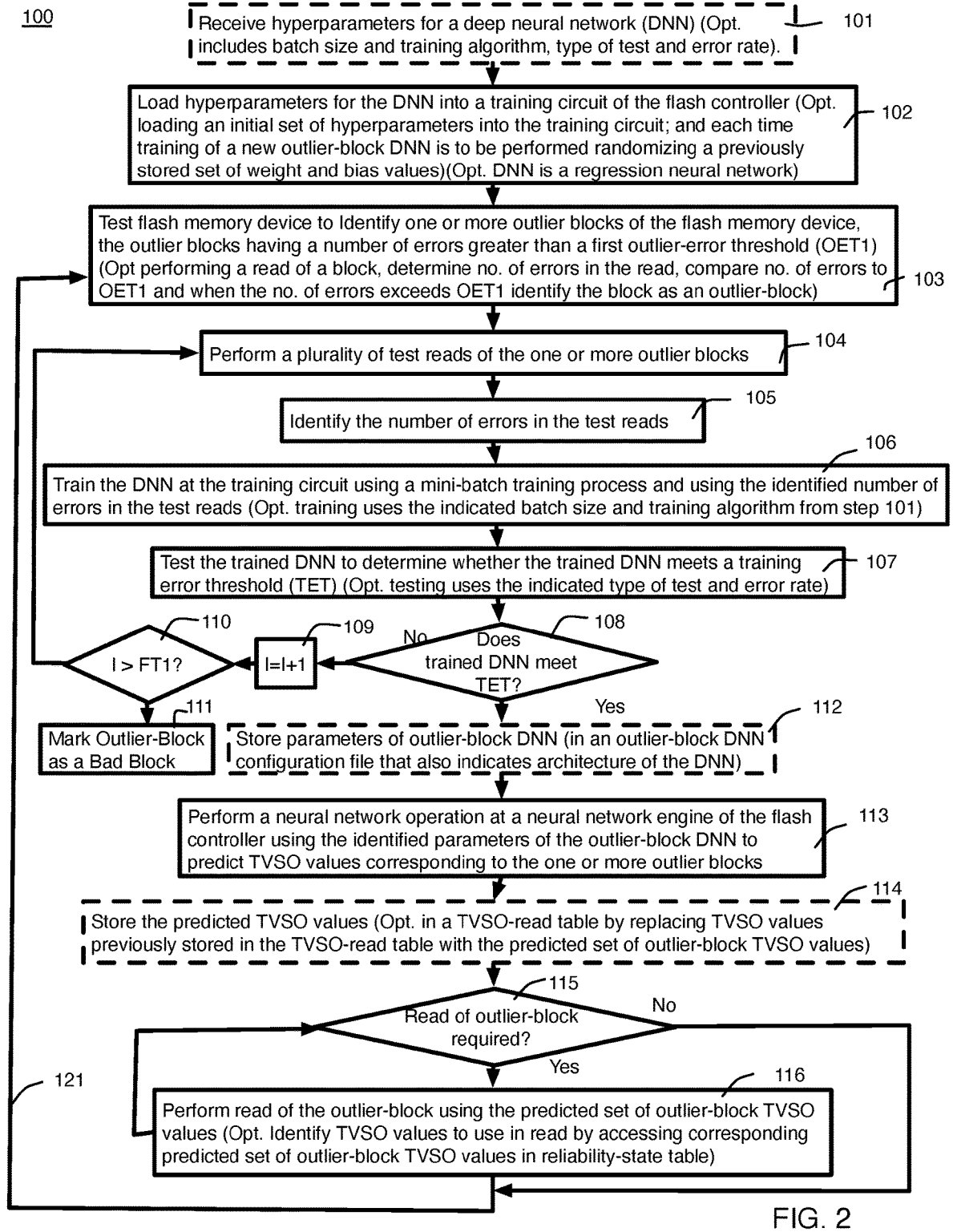
FIG. 2 is a diagram illustrating a method for outlier block management at a flash controller that uses TVSO values for performing reads of a flash memory device.

FIG. 2 illustrates a method (100) for outlier management at a flash controller that uses TVSO values for performing reads of a flash memory device. Hyperparameters for a DNN are optionally received (101). In FIG. 1 I/O circuit 11 optionally receives the initial hyperparameters from an external source such as a host computing device and stores the hyperparameters 16c in data storage circuit 4. Alternatively, hyperparameters 16c are stored in memory device (DRAM) 14. The hyperparameters can include one or more of: the number of layers, the number of neurons in each layer, the training algorithm to use, type of test to be used in the testing the trained DNN and a training error threshold (TET) for the testing, the batch size, the number of iterations of each mini-batch, initial weights and initial bias values.

Hyperparameters for a deep neural network (DNN) are loaded (102) into a training circuit of the flash controller. In one example, the first time that step 102 is performed the initial set of hyperparameters optionally received in step 101 is loaded into training circuit 13. In FIG. 1, control circuit 9 loads hyperparameters 16c into training circuit 13. In one example, one or more of the following hyperparameters are coupled to training circuit 13 in step 103: the number of layers, the number of neurons in each layer, the training algorithm to, type of test to be used in the testing the trained DNN and TET for the testing, the batch size, the number of iterations for each mini-batch, initial weights and initial bias values.

A flash memory device is tested to identify or more outlier blocks of the flash memory device (103), the one or more outlier blocks having a number of errors greater than a first outlier-error threshold (OET1). In FIG. 1, control circuit 9 identifies one or more outlier blocks of the flash memory devices 2, the outlier blocks having a number of errors greater than OET1. The term "outlier block," as used in the present application is a block of a flash memory device 2 having a number of errors greater than an error threshold and specifically includes a block of a flash memory device 2 having a number of errors greater than OET1. In one example outlier blocks are identified by determining the number of errors from a read and comparing it to an OET1 (e.g., that may be set by a user) and those blocks having an error exceeding OET1 are identified to be outlier blocks. In another example, the OET1 is a value that is set to be above the average error for the blocks being tested by a predetermined amount (e.g., twenty percent above the average). In this example background reads are performed and a running average error for the background reads is calculated and compared to the number of errors in the memory location being tested, and when the error of a memory location being tested exceeds the average error by the predetermined amount (e.g., twenty percent) the block containing the memory location being tested is determined to be an outlier block.

A plurality of test reads of the one or more outlier blocks are performed (104) and a number of errors in the test reads is identified (105). In FIG. 1 read circuit 6 performs a plurality of test reads of the identified one or more outlier blocks and decode circuit 7 identifies the number of errors in the test reads of the identified one or more outlier blocks. In one example, each iteration of step 104 includes a set of "N" test reads of the one or more outlier block, where N is equal to the batch size received in step 101. In one example N is fifty. However, N could also be five or ten. In one example the batch size and "N" is configurable by the user, with the user providing the input batch size in step 101.

In FIG. 1, control circuit 9 communicates a read command to read circuit 6. Read circuit 6, in response to the read command, sends the read command to the flash memory device 2 over one of channels 17-19 to read a particular memory location in the outlier block of one of flash memory devices 2. The response to the read command is received at read circuit 6 and is coupled to decode module 7 for decoding. Decode module 7 decodes the response to the read command and identifies the number of errors in the read. The number of errors in the read is coupled to training circuit 13 along with the feature values corresponding to the read that was performed. This process of reading, decoding and coupling the number of errors in the read to the training circuit 13 is repeated until all N reads have been performed, decoded and the feature values corresponding to the read that was performed and the error in the read that was performed coupled to training circuit 13. In one example training circuit 13 includes input registers and/or a cache memory configured to store the received data records.

Figure 3:
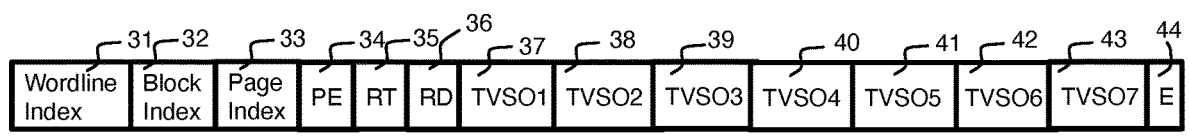
FIG. 3 is a block diagram illustrating a data record.

In one example that is illustrated in FIG. 3, a data record 30 is formed after each read that indicates the feature values corresponding to the read and the identified number of errors in the read. Data record 30 includes wordline index 31 that indicates the wordline of the memory location that was read, a block index 32 indicating the bock of the memory location that was read, a page index 33 indicating the page of the memory location that was read, the number of program and erase (PE) cycles for the block containing the memory location that was read 34, the RT of the block containing the memory location that was read 35, the RD of the block containing the memory location that was read 36, the TVSO values 37-43 used to perform the read (TVSO1, TVSO2, TVSO3, TVSO4, TVSO5, TVSO6 and TVSO7) and the number of errors in the read (E) 44.

Figure 4:
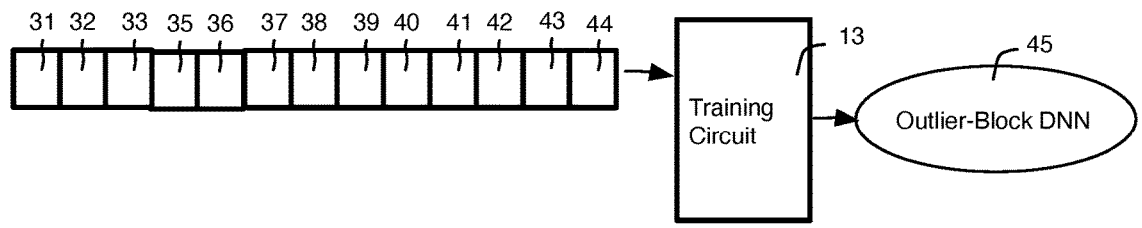
FIG. 4 is a block diagram illustrating an outlier-block DNN and the training of the outlier-block DNN.

The DNN is trained (106) at the training circuit using a mini-batch training process and using the identified number of errors in the test reads. In FIG. 1 training circuit 13 trains the DNN using a mini-batch training process and using the identified number of errors in the test reads. In the example shown in FIG. 4, feature values 31-33 and 35-36 (PE is not required for the training), TVSO values 37-43 and E 44 of each data record 30 are entered into training circuit 13 that performs mini-batch training to generate outlier-block DNN 45 that predicts TVSO values that minimize E 44. The term "outlier-block DNN," as used in the present application is a DNN that generates output indicating a set of TVSO values to be used for reading memory locations in the one or more outlier block (e.g., TVSO values that produce a minimum amount of error or an amount of error proximate a minimum amount of error when reading the particular memory location), and specifically includes a DNN that generates a set of TVSO values to be used for reading memory locations in a single outlier block, and further specifically includes a DNN that generates output indicating a set of TVSO values that produce a minimum amount of error (or an amount of error proximate a minimum amount of error) when reading a particular memory location in the single outlier block.

When input indicating a batch size and a training algorithm are received in step 101, the training of step 105 uses the indicated batch size and the indicated training algorithm. In one example, step 106 includes generating a neural network framework having the number of layers, the number of neurons in each layer and initial weights and initial bias values indicated by the hyperparameters optionally entered in step 101. The training process uses the training algorithm, the batch size, and the number of iterations in each mini-batch optionally entered in step 101 to perform the training.

The trained DNN is tested (107) to determine whether the trained DNN meets the TET. In FIG. 1 training circuit 13 tests the trained DNN to determine whether the trained DNN meets the TET. When the hyperparameters optionally received in step 101 indicating the type of test to be used in testing the trained DNN a TET for the testing, the testing of step 107 uses the indicated type of test and the indicated TET. In one example the input indicating the type of test indicates a min-squared error test and the TET is a min-squared error rate.

Steps 104-110 are repeated until the trained DNN meets the TET in step 108. When the trained DNN meets the TET the training produces an outlier-block DNN and the parameters of the outlier-block DNN are optionally stored as shown by step 112. In FIG. 1 the parameters consist of weights and bias values, and training circuit 13 stores a configuration file 16d for the outlier-block DNN in data storage 4 that includes the parameters. In one example the configuration file 16d for each outlier-block DNN includes, in addition to the parameters for the particular outlier-block DNN, values indicating the architecture of the outlier-block DNN such as the number of layers, the number of neurons in each layer, the connections between neurons and the type of activation function to use.

There is a possibility that the outlier-block is defective. In order to identify and remove defective outlier blocks the total number of iterations (I) in the training of a particular outlier block is determined by incrementing a counter (109) each time that the trained DNN fails to meet the TET and I is compared to a first outlier-block failure threshold (FT1) (110). In one example FT1 can be set by the user or the manufacturer of SSD 1, and can be a number sufficiently large such that the training process is unlikely to converge on results that meet the TET. When I exceeds FT1 the outlier-block is marked as a bad block (111) (e.g., by storing a value identifying the bad block (e.g. the block number) in bad block table 16e) such that the outlier-block is no longer used (it is "retired").

Figure 5:
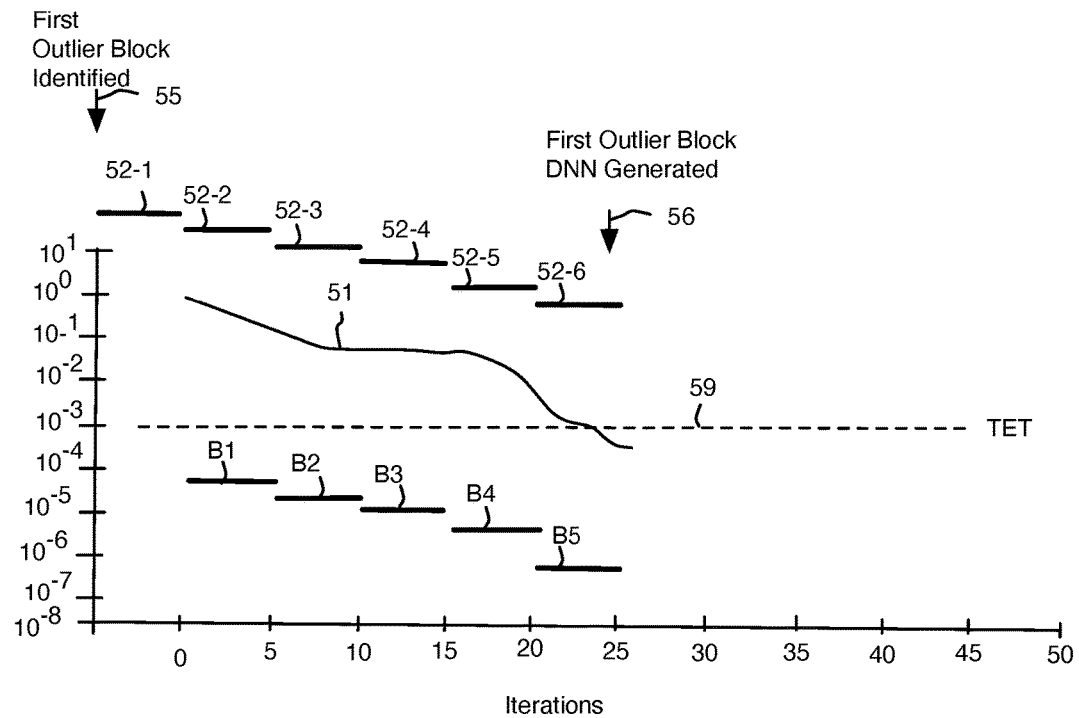
FIG. 5 is a diagram illustrating iterations on the x-axis and training error on the y-axis for training an outlier-block DNN for predicting a set of outlier-block TVSO values for a single outlier-block, where the training is stopped as soon as the training error reaches a TET.

FIG. 5 shows an example in which arrow 55 indicates the identification of a first outlier-block, arrow 56 indicates when the outlier-block DNN (the first-outlier-block DNN) is generated that predicts a set of TVSO values for the first outlier-block; and in which curved line 51 illustrates the error rate of the mini-batch training process. Each iteration of step 106 is a "mini-batch" of the training process and is indicated by one of lines B1 through B5, where a first set of M iterations are performed in a first mini-batch B1, a second set of M iterations are performed in a second mini-batch B2, a third set of M iterations are performed in a third mini-batch B3, a fourth set of M iterations are performed in a second mini-batch B4 and a fifth set of M iterations are performed in a fifth mini-batch B5. The y-axis of FIG. 5 indicates error, and the x-axis indicates the number of iterations. Each iteration of steps 104-105 is indicated by one of lines 52-1 through 52-6, including a first set of test reads and number of errors identification 52-1, a second set of test reads and number of errors identification 52-2, a third set of test reads and number of errors identification 52-3, a fourth set of test reads and number of errors identification 52-4, a fifth set of test reads and number of errors identification 52-5 and a sixth set of test reads and number of errors identification 52-6. In this example, the TET is a min$^2$ error rate of $10^{-3}$ that is shown as dashed line 59. In this example the number of test reads in each iteration of steps 104-105 is N (e.g., N memory locations in the outlier block are read and error is determined for all N reads), and all N samples are used in each iteration of the training process, with each iteration of step 106 (each mini-batch processing step) including M iterations of training in which the data records from all N reads (N data records) are used (where "M" is the number of iterations in each mini-batch).

The process of reading and determining the number of errors of steps 104-105 proceeds without pause for the corresponding mini-batch training process, with each set of reads and number of errors determination 52-1 through 52-5 immediately followed by the mini-batch training process step B1-B5 that uses the records 30 from that particular set of reads and number of errors determination. More particularly, the records 30 from the first set of reads and number of errors determination 52-1 is used to perform training of mini-batch B1; the records 30 from the second set of reads and number of errors determination 52-2 is used to perform training of mini-batch B2; the records 30 from the third set of reads and number of errors determination 52-3 is used to perform training of mini-batch B3; the records 30 from the fourth set of reads and number of errors determination 52-4 is used to perform training of mini-batch B4; and the records 30 from the fifth set of reads and number of errors determination 52-5 is used to perform training of mini-batch B5.

In one example mini-batch B1 through B5 each include M iterations, and in each iteration all N data records are input into the training circuit 13 and are used to train the DNN. When a gradient descent mini-batch training process is used, the mean gradient of the mini-batch is calculated and is used to update the weights and bias values. Mini-batch B1 starts with the initial weights and bias values optionally received in step 101 and reads/error determination 52-1 are input into training circuit 13 and M iterations of training using the N training records are performed, the mean gradient of the mini-batch is calculated and used to update the weights and bias values.

The testing of step 107 is performed after the training of each mini-batch. More particularly, testing is performed after mini-batch B1 to determine that the trained DNN does not meet the TET (since the trained DNN after mini-batch B1 has a $min_2$ error rate exceeding $10^{-3}$); testing is performed after mini-batch B2 to determine that the trained DNN does not meet the TET (since the trained DNN after mini-batch B2 has a min, error rate exceeding $10^{-3}$); testing is performed after mini-batch B3 to determine that the trained DNN does not meet the TET (since the trained DNN after mini-batch B3 has a $min^2$ error rate exceeding $10^{-3}$); testing is performed after mini-batch B4 to determine that the trained DNN does not meet the TET (since the trained DNN after mini-batch B4 has a $min^2$ error rate exceeding $10^{-3}$); and testing is performed after mini-batch B5 to determine that the trained DNN does meet the TET (since the trained DNN after mini-batch B5 has a $min^2$ error rate that does not exceed $10^{-3}$). In this example the iterative process of steps 104-107 ends and the trained DNN resulting from the training of mini-batch B5 is determined to be the first outlier-block DNN 56. The parameters (the weights and bias values from mini-batch B5) are stored (e.g., by training circuit 13) in configuration file for outlier-block DNN 16d (that may also be referred to hereinafter as an "outlier-block DNN configuration file") along with values indicating the architecture of the outlier-block DNN, including the number of layers, the number of neurons in each layer, the connections between neurons and the type of activation function to be performed.

Figure 6:
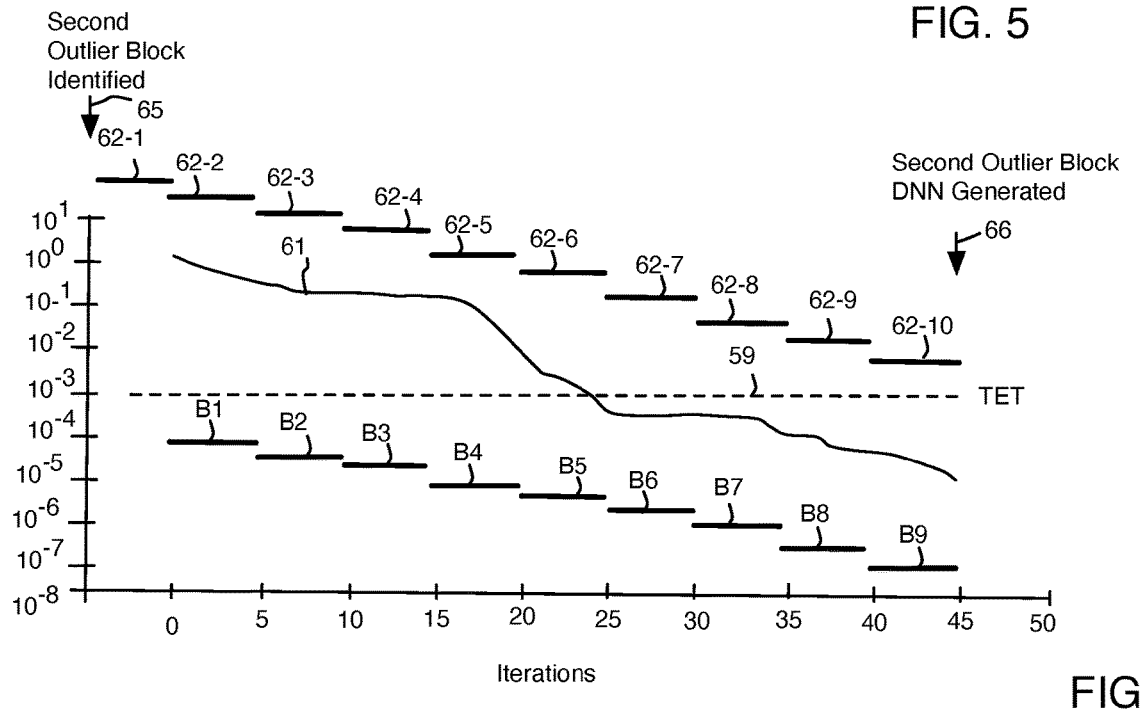
FIG. 6 is a diagram illustrating iterations on the x-axis and training error on the y-axis for training an outlier-block DNN for predicting a set of outlier-block TVSO values for a single outlier-block, where the training continues after the TET is reached.

FIG. 6 shows an example in which a second outlier-block is identified 65 and in which the process of steps 104-107 is continued after the TET is reached to obtain an outlier-block DNN 66 having a lower error rate than that of first outlier-block DNN 56 shown in FIG. 5. The x-axis of FIG. 6 indicates iterations, the y-axis indicates error and curved line 61 illustrates the error rate of the mini-batch training process. FIG. 6 shows set of test reads and error identification 62-1, set of test reads and error identification 62-2, set of test reads and error identification 62-3, set of test reads and error identification 62-4, set of test reads and error identification 62-5, set of test reads and error identification 62-6, set of test reads and error identification 62-7, set of test reads and error identification 62-8, set of test reads and error identification 62-9 and set of test reads and error identification 62-10 (that is not used). For example, the process may be extended as illustrated in FIG. 6 after TET is reached when there are no other outlier blocks that have been identified. However, at some point the process needs to be ended (here after B9) so as to not unnecessarily consume power and system resources, which may be done after B9.

Figure 7:
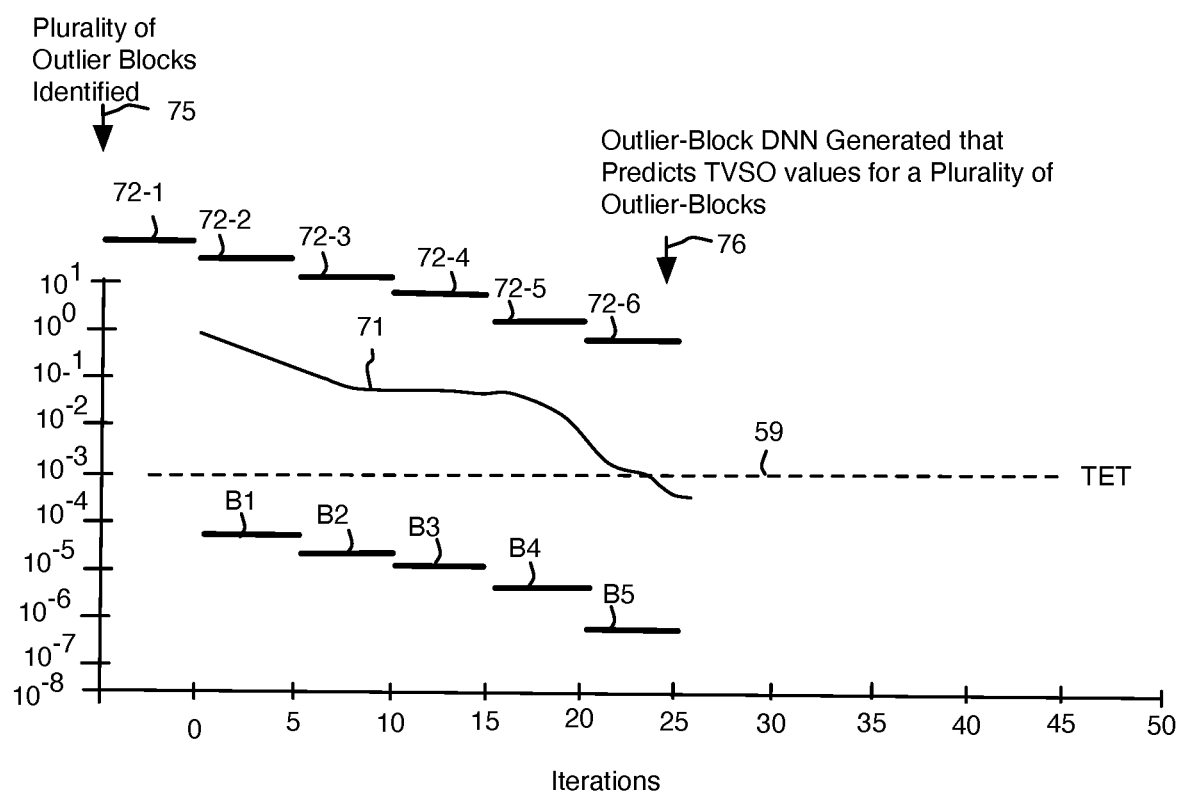
FIG. 7 is a diagram illustrating iterations on the x-axis and training error on the y-axis for training an outlier-block DNN for predicting a set of outlier-block TVSO values for a plurality of outlier-blocks.

In FIG. 5 outlier-block DNN 56 was generated using reads of a single outlier-block (first outlier-block 55) to identify a first set of parameters that are used for identifying TVSO values to be used for reading the first outlier block. In FIG. 6 outlier-block DNN 66 was generated using reads of a single outlier-block (second outlier-block 65) to identify a second set of parameters that are used for identifying TVSO values to be used for reading the second outlier block. Accordingly, the configuration files for generating outlier-block DNN 56 and 66 are configuration files for an outlier-block DNN for predicting a set of TVSO values for a single outlier-block. However, alternatively, an outlier block DNN can be generated that is operable to generate TVSO values for more than one outlier block. In one example that is illustrated in FIG. 7 each outlier-block DNN 76 predicts TVSO values for a plurality of outlier-blocks. A plurality of outlier-blocks are identified as shown by arrow 75 (step 103 of FIG. 2) and the sets of reads and number of errors determination 72-1 through 72-6 each read N memory locations from the plurality of outlier-blocks (steps 104-105 of FIG. 2). For example, if the plurality of identified outlier-blocks are two blocks and N is 50, 50 reads will be performed, 25 test reads from each of the two outlier-blocks. In this example, mini-batches B1-B5 train the DNN to predict TVSO values for the plurality of outlier blocks and the testing of step 107 tests the error rate in predicting TVSO values for the plurality of outlier blocks (e.g., both of the outlier blocks). When the error rate 71 of the mini-batch training process does not exceed the TET 59 an outlier-block DNN 76 is generated that can predict TVSO values for a plurality of outlier-blocks.

A neural network operation is performed (113) at a neural network engine of the flash controller using the identified parameters of the outlier-block DNN to predict a set of TVSO values corresponding to the one or more outlier blocks, that may be referred to hereinafter as a "set of outlier-block TVSO values." In FIG. 1, control circuit 9 loads the configuration file for the outlier-block DNN 16d into neural network engine 10. Neural network engine 10 performs a neural network operation using the parameters of the outlier-block DNN to predict the set of outlier-block TVSO values corresponding to the one or more outlier blocks. In one example neural network engine 10 includes configurable logic that is configured using the configuration file for an outlier-block DNN 16d or using other configuration files/data to generate a configured neural network engine that is operable to perform the neural network operation. In one example neural network engine 10 has some or all of the features shown in U.S. patent application Ser. No. 17/347,388 filed on Jun. 14, 2021, titled "Method and Apparatus for Performing a Neural Network Operation" which is incorporated by reference herein in its entirety. In this example, the configuration file indicates a number of input neurons, a number of output neurons, a number of layers of hidden neurons, a number of hidden neurons in each layer of hidden neurons, and a type of activation function module (AFM) (e.g. ReLU AFM, Leaky ReLU AFM, SatLin AFM, symmetric SatLin AFM or linear interpolation AFM).

Figure 8:
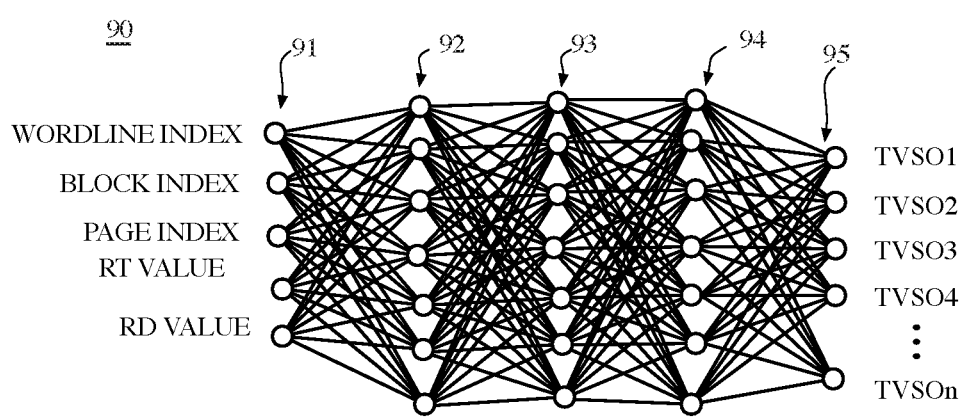
FIG. 8 is a block diagram illustrating an outlier-block DNN and inputs and outputs for a neural network operation of the outlier-block DNN.

FIG. 8 shows a diagram of an exemplary outlier-block DNN 90 that includes an input layer 91 including a plurality of input neurons, an output layer 95 including a plurality of output neurons and layers 92-94 of hidden neurons. In one example outlier-block DNN 90 is a neural network configured to predict TVSO values that minimize (or that are proximate the minimum) the number of errors in a read of the flash memory device 2 and the training algorithm is a gradient descend algorithm with five iterations in each mini-batch.

Input into the neural network operation includes a WORDLINE INDEX indicating a wordline of the outlier block that is input to a first input neuron, a BLOCK INDEX indicating a block of the outlier block that is input into a second input neuron, a PAGE INDEX indicating a page of the outlier block that is input into a third input neuron, a retention time value (RT VALUE) that indicates the retention time of the outlier block that is into a fourth input neuron, and a read disturb value (RD VALUE) that indicates the number of read disturbs for the outlier block that is entered into a fifth input neuron.

In one example n=7 and output neurons 95 include a first output neuron that generates output indicating a TVSO value for a first threshold voltage offset region (TVSO1), a second output neuron that generates output indicating a TVSO value for a second threshold voltage offset region (TVSO2) a third output neuron that generates output indicating a TVSO value for a third threshold voltage offset region (TVSO3); a fourth output neuron that generates output indicating a TVSO value for a fourth threshold voltage offset region (TVSO4); a fifth output neuron that generates output indicating a TVSO value for a fifth threshold voltage offset region (TVSO5); a sixth output neuron that generates output indicating a TVSO value for a sixth threshold voltage offset region (TVSO6); and a seventh output neuron that generates output indicating a TVSO value for a seventh threshold voltage offset region (TVSO7). In this example the output TVSO values TVSO1-TVSO7 from the neural network operation indicate TVSO values that minimize (or that are proximate the minimum) the number of errors when performing a read of the particular outlier-block. The seven threshold values represent the number of threshold values needed for a TLC memory device, however the embodiments are not meant to be so limited.

The predicted set of outlier-block TVSO values are optionally stored (114) in a TVSO-read table by replacing TVSO values previously stored in the TVSO-read table with the predicted set of outlier-block TVSO values. In FIG. 1 control circuit 9 and/or neural network 10 stores the predicted set of outlier-block TVSO values from the neural network operation in TVSO-read table 16*b*. In the Example shown in FIG. 1, the predicted set of outlier-block TVSO values for the outlier block stored in the TVSO-read table replace the TVSO values (e.g., PE-based-reliability-state TVSO values) previously stored in TVSO-read table 16*b*.

When read of the outlier block is required (115) the read is performed (116) using the predicted set of outlier-block TVSO values. In FIG. 1 read circuit 6 performs a read using the predicted set of outlier-block TVSO values. In one example, flash controller 3 receives a read instructions from a host computer at I/O circuit 11 and read circuit 6, upon receiving the read instruction, performs a lookup in TVSO-read table 16*b* using the current status (e.g., current number of read disturbs and retention time) of the memory location of the flash memory device 2 that is to be read to identify the set of outlier-block TVSO values to use in performing the read; sends a read command that includes the identified set of outlier-block TVSO values to a flash memory device 2 that is to be read; receives a response from the flash memory device 2 and decode circuit 7 decodes the results from the read command.

Accordingly, good blocks that are not identified as outlier-blocks are read using PE-based-reliability-state TVSO values as is known in the art and outlier-blocks are read using a set of outlier-block TVSO values as shown in steps 115-116.

The testing and identifying additional sets of outlier-block TVSO values is repeated as shown by line 121. The testing identifying additional sets of outlier-block TVSO values is performed continuously, periodically or at idle periods throughout the lifetime of SSD 1. Though step 102 could also be repeated, since the hyperparameters are already loaded into training circuit 13, it may not be required to load them again. In one example, the weights and bias values stored in training circuit 13 are randomized by training circuit 13 before beginning the subsequent step 103. More particularly, training circuit 13, decode circuit 7 and control circuit 9 repeat the testing flash memory device to identify one or more additional outlier-block, the performing the plurality of test reads, the identifying the number of errors in the test reads, the training and the testing until the trained DNN meets the training error threshold to identify parameters of an additional outlier-block DNN (for the one or more additional outlier-block) and a neural network operation of the additional outlier-block DNN is performed to predict an additional set of outlier-block TVSO values to be used for reading the one or more additional outlier-block.

In one example, each time a single outlier-block is identified steps 104-108 a single outlier-block DNN is trained to identify a set of outlier-block TVSO values for the single outlier block. Accordingly, step 103 will identify a single outlier-block, step 104 will perform test reads of the single outlier-block, step 105 will identify the number of errors in the test reads of the single outlier-block and the neural network operation of step 113 will generate a predicted set of outlier-block TVSO values for the single outlier block. In this example, the testing and identifying additional sets of outlier-block TVSO values is repeated (line 121) in the same manner. More particularly, step 103 will identify an additional (single) outlier-block, step 104 will perform test reads of the additional (single) outlier-block, step 105 will identify the number of errors in the test reads of the additional (single) outlier-block and the neural network operation of step 113 will generate a predicted set of outlier-block TVSO values for the additional (single) outlier block. In this example, all configuration files for an outlier-block DNN stored in step 112 and all outlier-block DNN's used to perform neural network operations in step 113 predict a set of outlier-block TVSO values for a single outlier block.

Because the outlier-block DNN is a neural network for identifying TVSO values for a single outlier block or for a small number of outlier-blocks, the accuracy of the TVSO value prediction is improved as compared to TVSO values identified using PE-based-reliability-states that predict TVSO values for a large number of blocks because the outlier-block DNN does not have to encompass a wide range of samples (data for numerous blocks, all of which have different characteristics) and a wide span of PE cycles.

Method 100 is performed to generate and optionally store predicted TVSO values for outlier blocks. It is appreciated that the PE-based-reliability-state TVSO values for non-outlier blocks will vary with the number of PE cycles and the sets of outlier-block TVSO values will not vary with increasing PE cycles. Accordingly, in the example in which TVSO-read table 16*b* includes only a PE cycle index and block number index associated with each set of PE-based-reliability-state TVSO values, each of the sets of outlier-block TVSO values will be stored by replacing all corresponding PE-based-reliability-state TVSO values for the particular block number without regard to the number of PE cycles, such that the predicted set of outlier-block TVSO values will be used for all subsequent values of PE cycles. In FIG. 1 both the PE-based-reliability-state TVSO values for non-outlier blocks and sets of outlier-block TVSO values are stored in TVSO-read table 16*b*.

Figure 9:
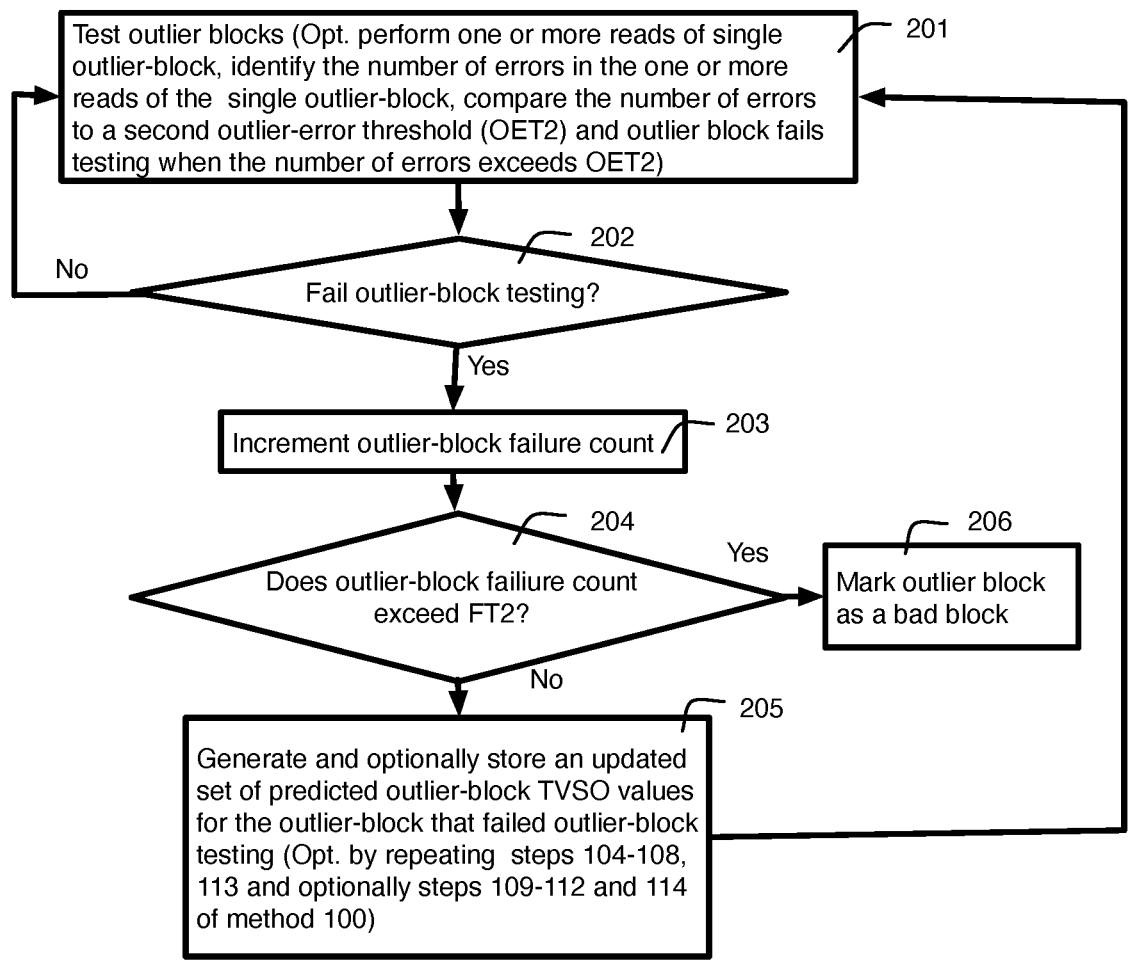
FIG. 9 is a diagram illustrating a method for managing outlier blocks in which outlier-blocks are retired by identifying the outlier block to be retired as a bad-block.

Though method 100 is effective for predicting TVSO values for outlier blocks, it is possible that, after time has passed one of more of the outlier-blocks for which TVSO has been calculated may continue to diverge or may simply change as a result of usage, causing the predicted TVSO value for the outlier block to no longer be accurate. In method 200 shown in FIG. 9 the outlier blocks are tested (201). In one example step 201 includes testing a single outlier-block by performing one or more reads of the single outlier-block after some or all of the steps of method 100 have been performed, determining the number of errors in the one or more reads of the single outlier-block and comparing the number of errors in the one or more reads of the single outlier-block to a second outlier-error threshold (OET2). When the number of errors in the read of the single outlier block exceed OET2 the outlier-block being tested fails the outlier-block testing and the method moves to step 203.

It is possible that an outlier-block is defective and that it will repeatedly fail outlier-block testing of step 201. To identify defective blocks before they can negatively impact operation of SSD 1, each time that an outlier block fails the testing of step 201 an outlier block failure count is incremented (203) and when the outlier-block failure count exceeds (204) a second outlier-block failure threshold (FT2) the outlier-block is retired by marking it as a bad block (206). In FIG. 1 the outlier-block is retired by storing an index identifying the block (e.g., the block number) in bad block table 16*e*. FT2 is initially set to a default value and can be set by the user or the manufacturer of SSD. In one example FT2 is set low enough so as to prevent an outlier-block from unnecessarily consuming power and other resources of flash controller 3, but high enough to allow most outlier-blocks to continue to be used for the remainder of the life of the outlier-block.

When the outlier-block fails the outlier-block testing of step 201 and the outlier-block failure count does not exceed FT2, an updated set of predicted outlier-block TVSO values are generated (and optionally stored) for the outlier-block that failed the outlier-block testing (205) by repeating steps 104-108 and 113 (and optionally steps 109-112 and 114) of method 100. Thereby, the sets of outlier-block TVSO values are kept current, maintaining UBER of the SSD within acceptable levels during the lifetime of the SSD.

The method and apparatus of FIGS. 1-9 manages outlier blocks by performing neural network operations that accurately predict the TVSO values to be used for reading outlier blocks, allowing the outlier blocks to continue to be used even after they are identified as outlier-blocks. Thereby, the method and apparatus of the present invention does not require that outlier blocks be marked as bad blocks and retired as soon as they are identified as outlier blocks in order to prevent uncorrectable bit errors. Thereby the life of outlier-blocks is extended and the amount of blocks available to store information is increased as compared to systems that mark outlier blocks as bad blocs as soon as they are identified as outlier blocks. Accordingly, the present method and apparatus extends the useful life of outlier blocks while maintaining UBER of the SSD within acceptable levels during the lifetime of the SSD.

In the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

The invention claimed is:

1. A method for outlier block management at a flash controller that uses threshold voltage shift offset (TVSO) values for performing reads of a flash memory device, the method comprising:
   testing the flash memory device to identify one or more outlier blocks of the flash memory device, the one or more outlier blocks having a number of errors greater than a first outlier-error threshold;
   loading hyperparameters for a deep neural network (DNN) into a training circuit of the flash controller;
   performing a plurality of test reads of the one or more outlier blocks;
   identifying a number of errors in the test reads;
   training the DNN at the training circuit using a mini-batch training process and using the identified number of errors in the test reads;
   testing the trained DNN to determine whether the trained DNN meets a training error threshold;
   repeating the performing the plurality of test reads, the identifying the number of errors in the test reads, the training and the testing until the trained DNN meets the training error threshold to identify parameters of an outlier-block DNN;
   performing a neural network operation at a neural network engine of the flash controller using the identified parameters of the outlier-block DNN to predict a set of TVSO values corresponding to the one or more outlier blocks; and
   performing a read using the predicted TVSO values.

2. The method of claim 1 further comprising storing the predicted TVSO values.

3. The method of claim 2 wherein the storing comprises storing the predicted TVSO values in a TVSO-read table by replacing TVSO values previously stored in the TVSO-read table with the predicted TVSO values.

4. The method of claim 1 wherein the testing the flash memory device to identify one or more outlier blocks comprises:
   performing a read of a block of the flash memory device;
   determining the number of errors in the read;
   comparing the number of errors in the read to the first outlier-error threshold; and
   when the number of errors exceeds the first outlier-error threshold, identifying the block that was read as an outlier block.

5. The method of claim 4 further comprising:
   testing a single outlier-block by performing one or more reads of the single outlier-block, determining the number of errors in the one or more reads of the single outlier-block and comparing the number of errors in the one or more reads of the single outlier-block to a second outlier-error threshold; and wherein the single outlier-block fails the testing when the number of errors in the one or more reads of the single outlier block exceed the second outlier-error threshold;

when the single outlier-block fails the testing generating an updated set of predicted outlier-block TVSO values for the block that failed the outlier-block testing.

6. The method of claim 5 wherein the total number of iterations in the training of a particular outlier block is determined and is compared to a first failure threshold and the particular outlier-block is marked as a bad block when the outlier block failure count exceeds the first failure threshold.

7. The method of claim 6 an outlier-block failure count is incremented each time that the number of errors in the read of the single outlier block exceed the second outlier-error threshold and when the outlier block failure count exceeds a second failure threshold the single-outlier-block is marked as a bad block.

8. The method of claim 1 wherein the loading hyperparameters for the DNN comprises:
  loading an initial set of hyperparameters into the training circuit; and
  each time training of a new DNN is to be performed randomizing a previously stored set of weights and bias values.

9. The method of claim 1 comprising each time one or more outlier block are identified, repeating the performing the plurality of test reads of the one or more outlier-blocks, the identifying the number of errors in the test reads, the training, the testing, the continuing, the performing the neural network operation and the storing.

10. The method of claim 1 comprising receiving input indicating a batch size and a training algorithm, wherein the training the DNN uses the indicated batch size and the indicated training algorithm.

11. The method of claim 1 comprising receiving input indicating the type of test to be used in the testing the trained DNN and input indicating a predetermined error rate for the testing, and wherein the testing the trained DNN uses the indicated type of test and wherein the training error threshold is met when the trained DNN meets the predetermined error rate.

12. A flash controller including a read circuit coupled to a TVSO-read table indicating threshold voltage shift offset (TVSO) values to be used for reading a flash memory device and a decode circuit coupled to the read circuit, the decode circuit to decode reads of the flash memory device, the flash controller comprising:
  a training circuit;
  a control circuit coupled to the training circuit, the control circuit to identify one or more outlier blocks of the flash memory device, the outlier blocks having a number of errors greater than an outlier-error threshold, and to load hyperparameters for a deep neural network (DNN) into the training circuit,
  wherein the read circuit is to perform a plurality of test reads of the identified one or more outlier blocks,
  wherein the decode circuit is to identify the number of errors in the test reads of the identified one or more outlier blocks,
  wherein the training circuit is to train the DNN using a mini-batch training process and using the identified number of errors in the test reads,
  wherein the training circuit is to test the trained DNN to determine whether the trained DNN meets a training error threshold;
  wherein the training circuit, the decode circuit and the control circuit are to repeat the performing the plurality of test reads, the identifying the number of errors in the test reads, the training and the testing until the trained DNN meets the training error threshold to identify parameters of an outlier-block DNN; and
  a neural network circuit coupled to the training circuit and the control circuit, the neural network engine to perform a neural network operation using the parameters of the outlier-block DNN to predict a set of outlier-block TVSO values corresponding to the one or more outlier blocks, and
  wherein the read circuit is to perform a read using the predicted TVSO values.

13. The flash controller of claim 12 wherein the outlier-block DNN is a regression neural network.

14. The flash controller of claim 12 wherein the training circuit uses a gradient descent algorithm to train the DNN.

15. The flash controller of claim 14 wherein the number of iterations in each mini-batch of the gradient descent algorithm is received as input.

16. A method for outlier management at a flash controller that uses threshold voltage shift offset (TVSO) values for performing reads of a flash memory device, the method comprising:
  testing the flash memory device to identify one or more outlier blocks of the flash memory device, the one or more outlier blocks having a number of errors greater than a first outlier-error threshold;
  loading hyperparameters for a deep neural network (DNN) into a training circuit of the flash controller;
  performing a plurality of test reads of the one or more outlier blocks;
  identifying a number of errors in the test reads;
  training the DNN at the training circuit using a mini-batch training process and using the identified number of errors in the test reads;
  testing the trained DNN to determine whether the trained DNN meets a training error threshold;
  repeating the performing the plurality of test reads, the identifying the number of errors in the test reads, the training and the testing until the trained DNN meets the training error threshold to identify parameters of an outlier-block DNN;
  performing a neural network operation at a neural network engine of the flash controller using the identified parameters of the outlier-block DNN to predict a set of outlier-block TVSO values corresponding to the one or more outlier blocks;
  performing a read using the predicted TVSO values;
  testing a single outlier-block by performing one or more reads of the single outlier-block, determining the number of errors in the one or more reads of the single outlier-block and comparing the number of errors in the one or more reads of the single outlier-block to a second outlier-error threshold, wherein the single outlier-block fails the testing when the number of errors in the one or more reads of the single outlier block exceed the second outlier-error threshold; and
  when the single outlier-block fails the testing generating an updated set of predicted outlier-block TVSO values for the block that failed the outlier-block testing.

17. The method of claim 16 further comprising:
  identifying one or more additional outlier blocks, and each time one or more additional outlier block is identified repeating the performing the plurality of test reads, the identifying the number of errors in the test reads, the training, the testing, the repeating, and the performing a neural network operation.

18. The method of claim 17 wherein the total number of iterations in the training of a particular outlier block is determined and is compared to a first failure threshold and the particular outlier-block is marked as a bad block when the outlier block failure count exceeds the first failure threshold.

19. The method of claim 18 an outlier-block failure count is incremented each time that the number of errors in the read of the single outlier block exceed the second outlier-error threshold and when the outlier block failure count exceeds a second failure threshold the single-outlier-block is marked as a bad block.

20. The method of claim 16 wherein the mini-batch training process is a gradient descent training process.

\* \* \* \* \*

UNITED STATES PATENT AND TRADEMARK OFFICE
CERTIFICATE OF CORRECTION

PATENT NO. : 11,514,994 B1
APPLICATION NO. : 17/506735
DATED : November 29, 2022
INVENTOR(S) : Lorenzo Zuolo and Rino Micheloni It is certified that error appears in the above-identified patent and that said Letters Patent is hereby corrected as shown below:

In the Claims

Column 17, Line 27 of Claim 9, replace "1" with --2--.

Column 17, Line 31 of Claim 9, replace "continuing" with --repeating--.

Column 19, Line 9 of Claim 19, after the number "18" add the word --wherein--.

Signed and Sealed this
Sixteenth Day of July, 2024

Katherine Kelly Vidal
*Director of the United States Patent and Trademark Office*